US007106236B2

(12) United States Patent
Asami et al.

(10) Patent No.: US 7,106,236 B2
(45) Date of Patent: Sep. 12, 2006

(54) METHOD FOR CONVERTING A/D, AND AN A/D CONVERTING APPARATUS

(75) Inventors: Koji Asami, Tokyo (JP); Kiyoshi Hashiba, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/965,009

(22) Filed: Oct. 14, 2004

(65) Prior Publication Data

US 2005/0270213 A1 Dec. 8, 2005

(30) Foreign Application Priority Data

Jun. 1, 2004 (JP) .............................. 2004-163704

(51) Int. Cl.
*H03M 1/12* (2006.01)

(52) U.S. Cl. ...................................... 341/155; 341/120

(58) Field of Classification Search ................ 341/155, 341/120, 126, 118, 119
See application file for complete search history.

(56) References Cited

U.S. PATENT DOCUMENTS

| 5,392,044 | A | * | 2/1995 | Kotzin et al. ................ 341/155 |
| 5,568,142 | A | * | 10/1996 | Velazquez et al. ........... 341/126 |
| 6,081,215 | A | * | 6/2000 | Kost et al. ................... 341/120 |
| 6,225,934 | B1 | * | 5/2001 | Ohashi et al. ............... 341/155 |
| 6,392,583 | B1 | * | 5/2002 | Bosselmann et al. ....... 341/155 |
| 6,525,682 | B1 | * | 2/2003 | Yap et al. .................... 341/137 |
| 6,894,630 | B1 | * | 5/2005 | Massie et al. .............. 341/118 |
| 6,972,552 | B1 | * | 12/2005 | Ursic ......................... 324/71.3 |

FOREIGN PATENT DOCUMENTS

| JP | 3-128473 | | 5/1991 |
| JP | 2000-346913 | | 12/2000 |
| WO | WO 01/33717 | * | 5/2001 |

OTHER PUBLICATIONS

Patent Abstracts of Japan, Publication No. 2000-346913 dated Dec. 15, 2000, 2 pages.
Patent Abstracts of Japan, Publication No. 03-128473, Publication Date: May 31, 1991, 2 pages.
Japanese Office Action for Japanese Application No. 2005-504180 mailed on Aug. 30, 2005, 2 pages.

* cited by examiner

*Primary Examiner*—Jean Bruner Jeanglaude
(74) *Attorney, Agent, or Firm*—Osha Liang LLP

(57) ABSTRACT

An analog-to-digital converting method for converting an analog signal into a digital signal is provided, wherein the analog-to-digital converting method includes a measuring step of measuring a frequency characteristic of each of analog-to-digital converters in advance, a sampling step of sampling the analog signal, a Fourier transformation step of performing Fourier transformation on the data sampled by the plurality of analog-to-digital converters and generating a plurality of frequency domain signals, a correcting step of converting each of the frequency domain signals into a signal to be acquired in case that the frequency characteristic of corresponding analog-to-digital converter is ideal, by multiplying each of the frequency domain signals by a correction coefficient determined on the basis of the frequency characteristics of all the analog-to-digital converters, and a synthesizing step of synthesizing each of the frequency domain signals acquired at the correcting step and generating a frequency spectrum of the digital signal.

14 Claims, 7 Drawing Sheets

METHOD FOR CONVERTING A/D, AND AN A/D CONVERTING APPARATUS

BACKGROUND OF THE INVENTION

1. Field of the Invention

The present invention relates to a method for converting A/D and an A/D converting apparatus for converting an analog signal into a digital signal. The present application claims the benefit of, and priority to, Japanese patent application No. 2004-163704 filed on Jun. 1, 2004, the entire contents of which are incorporated herein by reference for all purposes.

2. Description of the Related Art

Conventionally, in order to increase an apparent sampling rate in case of converting an analog signal into a digital signal, a N-way interleave a method for converting A/D using N analog-to-digital converters (hereinafter, referred to "ADC") was known (For example, see Japanese Laid-open patent application 2000-346913).

However, for the above mentioned interleave a method for converting A/D, if there are errors in the phase of a sampling clock applied to each ADC and the frequency characteristic of each ADC, it is impossible to acquire a frequency spectrum of the digital signal precisely.

For example, although the phase of each sampling clock applied to each ADC needs to be different by a predetermined phase from each other, it is difficult to shift the phase of each sampling clock by the predetermined phase precisely. Further, even when a sampling clock is applied to each ADC with a correct phase, if the frequency characteristic of the ADC is not ideal, fluctuations occur in the sampling timing and gain of each ADC and it is difficult to acquire the frequency spectrum of the digital signal precisely.

Accordingly, an object of the present invention is to provide an interleave AD converting method and an interleave AD converting apparatus, which are capable of overcoming the above drawbacks accompanying the conventional art. The above object can be achieved by combinations described in the independent claims. The dependent claims define further advantageous and exemplary combinations of the present invention.

SUMMARY OF THE INVENTION

In order to solve the problems above, according to a first aspect of the present invention, an analog-to-digital converting method for converting an analog signal into a digital signal by using a plurality of analog-to-digital converters, wherein phases of sampling clocks applied to the plurality of analog-to-digital converters differ by a predetermined period, is provided, wherein the analog-to-digital converting method includes a measuring step of measuring a frequency characteristic of each analog-to-digital converter in advance, a sampling step of sampling the analog signal by using the plurality of analog-to-digital converters, a Fourier transformation step of performing Fourier transformation on the data sampled by each of the plurality of analog-to-digital converters and generating a plurality of frequency domain signals corresponding to the plurality of analog-to-digital converters, a correcting step of converting each of the frequency domain signals into a signal to be acquired in case that the frequency characteristic of corresponding analog-to-digital converter is ideal, by multiplying each frequency domain signal by a correction coefficient determined on the basis of the frequency characteristics of all the analog-to-digital converters, and a synthesizing step of synthesizing each of the frequency domain signals acquired at the correcting step and generating a frequency spectrum of the digital signal.

For the correcting step, the frequency characteristic of one of the plurality of the analog-to-digital converters may be set as an ideal frequency characteristic. The correcting step includes a first acquiring step of acquiring first correcting coefficients, by which each frequency domain signal is multiplied, on the basis of the frequency characteristics of all the analog-to-digital converters in order to totally eliminate spurious components due to the frequency characteristic of each analog-to-digital converter, and a second acquiring step of acquiring a second correction coefficient based on each of the fist correction coefficients and the frequency characteristic of each analog-to-digital converter, in order to correct errors in the phase of each frequency domain signal generated by the multiplication of the first correction coefficients. Then, each frequency domain signal is multiplied by corresponding first correction coefficient. At the synthesizing step, the frequency domain signals, each of which is multiplied by corresponding first correction coefficient, are synthesized and the synthesized signal may be multiplied by the second correction coefficient.

The correcting step includes a first acquiring step of acquiring first correcting coefficients, by which each frequency domain signal is multiplied, on the basis of the frequency characteristics of all the analog-to-digital converters in order to totally eliminate spurious components due to the frequency characteristic of each analog-to-digital converter, and a second acquiring step of acquiring second correction coefficients based on each of the fist correction coefficients and the frequency characteristic of each analog-to-digital converter, in order to correct errors in the phase of each frequency domain signal generated by the multiplication of the first correction coefficients. Then, each frequency domain signal may be multiplied by corresponding first correction coefficient and corresponding second correction coefficient.

At the correction step, the frequency band of the digital signal to be acquired is divided according to the number of the analog-to-digital converters. Further, each first correction coefficient may be acquired at every divided frequency band at the first acquiring step, and the second correction coefficient may be acquired at every divided frequency band at the second acquiring step.

At the first acquiring step, the first correction coefficients are acquired at every divided frequency band at said first acquiring step, and the first correction coefficients totally eliminate the spurious components of each frequency domain signal which exist in each divided frequency band.

At the measuring step, by measuring the frequency characteristic of each analog-to-digital converter by using the sampling clock which is to be applied to each analog-to-digital converter when the analog signal is converted into a digital signal, the frequency characteristic including phase errors of the sampling clock to be applied to each analog-to-digital converter may be measured.

The analog-to-digital converting method generates a digital signal by using N analog-to-digital converters (Here, N is an integer equal to or larger than two (2).), and N frequency domain signals $X_0(f)$ to $X_{N-1}(f)$ are represented by the following equations, $$X_0(f) = \bar{x}(-l) + \bar{x}(-l+1) + \cdots + \bar{x}(m-1) + \bar{x}(m)$$

$$X_1(f) = a_1(-l)\bar{x}(-l) + a_1(-l+1)\bar{x}(-l+1) + \cdots + a_1(m-1)\bar{x}(m)$$

$$\vdots$$

$$X_{N-1}(f) = a_{N-1}(-l)\bar{x}(-l) + a_{N-1}(-l+1)\bar{x}(-l+1) + \cdots + a_{N-1}(m-1)\bar{x}(m)$$

(Here; $f_s$ represents the sampling frequency of each analog-to-digital converter, the terms from $-l$ to m in the above equations represent the components included in the band [0, $N_{fs}$] in case that the band of X(f) is set to [$-N_{fs}/2$, $N_{fs}/2$], and $a_j(k)$ is a component corresponding to $$\bar{x}(k)$$

of the frequency characteristic of j-th analog-to-digital converter.).

For the first acquiring step, the first correction coefficients $L_1, L_2, \ldots, L_{N-1}$ which satisfy the following equation, $$X_0(f) + L_1 X_1(f) + L_2 X_2(f) + \ldots + L_{N-1} X_{N-1}(f) = \alpha \bar{x}(0) + \beta \bar{x}(u)$$

(In the above equation, $\alpha$ and $\beta$ are arbitrary real numbers and x(u) is an aliasing component of x(0).), may be acquired.

The second correction coefficient represented by the following expression, $$\frac{1}{1 + a_1(0)L_1 + a_2(0)L_2 + \cdots + a_{N-1}(0)L_{N-1}}$$

may be acquired at the second acquiring step, and the digital signal X'(f) may be acquired on the basis of the following equation, $$X'(f) \frac{(1)}{1 + a_1(0)L_1 + a_2(0)L_2 + \cdots + a_{N-1}(0)L_{N-1} + L_2 X_2(f) + \cdots + L_{N-1} X_{N-1}(f)} \{X_0(f) + L_1 X_1(f)$$

at the synthesizing step.

When the analog-to-digital converting method generates a digital signal by using four (4) analog-to-digital converters, the frequency domain signals $X_0(f)$ to $X_3(f)$ are represented by the following equations, $$X_0(f) = \bar{x}(-1) + \bar{x}(0) + \bar{x}(1) + \bar{x}(2) + \bar{x}(3) + \bar{x}(4) + \bar{x}(5)$$

$$X_1(f) = a_1(-1)\bar{x}(-1) + a_1(0)\bar{x}(0) + a_1(1)\bar{x}(1) + a_1(2)\bar{x}(2) + a_1(3)\bar{x}(3) + a_1(4)\bar{x}(4) + a_1(5)\bar{x}(5)$$

$$X_2(f) = a_2(-1)\bar{x}(-1) + a_2(0)\bar{x}(0) + a_2(1)\bar{x}(1) + a_2(2)\bar{x}(2) + a_2(3)\bar{x}(3) + a_2(4)\bar{x}(4) + a_2(5)\bar{x}(5)$$

$$X_3(f) = a_3(-1)\bar{x}(-1) + a_3(0)\bar{x}(0) + a_3(1)\bar{x}(1) + a_3(2)\bar{x}(2) + a_3(3)\bar{x}(3) + a_3(4)\bar{x}(4) + a_3(5)\bar{x}(5)$$

(Here, $f_s$ represents the sampling frequency of each analog-to-digital converter, the terms from k=$-1$ to 5 in the above equations represent the components included in the band [0, $4f_s$] in case that the band of X(f) is set to [$-2f_s$, $2f_s$], and $a_j(k)$ is a component corresponding to $$\bar{x}(k)$$

of the frequency characteristic of j-th analog-to-digital converter.).

For the first acquiring step, the first correction coefficients $L_1, L_2, \ldots, L_{N-1}$ which satisfy the following equation, $$X_0(f) + L_1 X_1(f) + L_2 X_2(f) + L_3 X_3(f) = \alpha \bar{x}(0) + \beta \bar{x}(4)$$

(In the above equation, $\alpha$ and $\beta$ are arbitrary real numbers and x(u) is an aliasing component of x(0).), may be acquired.

The second correction coefficient represented by the following expression, $$\frac{1}{1 + a_1(0)L_1 + a_2(0)L_2 + a_3(0)L_3}$$

may be acquired at the second acquiring step, and the frequency spectrum of the digital signal X'(f) may be acquired on the basis of the following equation, $$X'(f) = \frac{1}{1 + a_1(0)L_1 + a_2(0)L_2 + a_3(0)L_3} \{X_0(f) + L_1 X_1(f) + L_2 X_2(f) + L_3 X_3(f)\}$$

at the synthesizing step.

At the correcting step, the frequency band of the digital signal which is to be acquired may be divided into a first region of which band is [0, $f_s$], a second region of which band is [$f_s$, $2f_s$], a third region of which band is [$2f_s$, $3f_s$], and a fourth region of which band is [$3f_s$, $4f_s$]. Further, at the first acquiring step, the first correction coefficient for the first region may be acquired on the basis of the following equation, $$\begin{pmatrix} L_1 \\ L_2 \\ L_3 \end{pmatrix} = \begin{pmatrix} a_1(-1) & a_2(-1) & a_3(-1) \\ a_1(1) & a_2(1) & a_3(1) \\ a_1(2) & a_2(2) & a_3(2) \end{pmatrix}^{-1} \begin{pmatrix} -1 \\ -1 \\ -1 \end{pmatrix}$$

the first correction coefficients for the second and the third regions are acquired on the basis of the following equation, $$\begin{pmatrix} L_1 \\ L_2 \\ L_3 \end{pmatrix} = \begin{pmatrix} a_1(1) & a_2(1) & a_3(1) \\ a_1(2) & a_2(2) & a_3(2) \\ a_1(3) & a_2(3) & a_3(3) \end{pmatrix}^{-1} \begin{pmatrix} -1 \\ -1 \\ -1 \end{pmatrix}$$

and the first correction coefficient for the fourth region is acquired on the basis of the following equation, $$\begin{pmatrix} L_1 \\ L_2 \\ L_3 \end{pmatrix} = \begin{pmatrix} a_1(2) & a_2(2) & a_3(2) \\ a_1(3) & a_2(3) & a_3(3) \\ a_1(5) & a_2(5) & a_3(5) \end{pmatrix}^{-1} \begin{pmatrix} -1 \\ -1 \\ -1 \end{pmatrix}$$

At the synthesizing step, the frequency spectrum of the digital signal X'(f) for each of the first and the second regions may be acquired on the basis of the following equation, $$X'(f) = \frac{1}{1+a_1(0)L_1+a_2(0)L_2+a_3(0)L_3}\{X_0(f)+L_1X_1(f)+L_2X_2(f)+L_3X_3(f)\}$$

and
the frequency spectrum of the digital signal X' (f) for each of the third and the fourth regions may be acquired on the basis of the following equation, $$X'(f) = \frac{1}{1+a_1(4)L_1+a_2(4)L_2+a_3(4)L_3}\{X_0(f)+L_1X_1(f)+L_2X_2(f)+L_3X_3(f)\}$$

According to a second aspect of the present invention, an analog-to-digital converting apparatus for converting an analog signal into a digital signal is provided, wherein the analog-to-digital converting apparatus includes a plurality of analog-to-digital converters, phases of sampling clocks applied to the plurality of analog-to-digital converters being different by a predetermined phase, a measuring unit for measuring the frequency characteristic of each analog-to-digital converter in advance, a Fourier transformation unit for performing Fourier transformation on the data sampled by each of the plurality of analog-to-digital converters and generating a plurality of frequency domain signals corresponding to the plurality of analog-to-digital converters, a correcting unit for converting each of the frequency domain signals into a signal acquired in case that the frequency characteristic of corresponding analog-to-digital converter is ideal, by multiplying each frequency domain signal by a correction coefficient determined on the basis of the frequency characteristics of all the analog-to-digital converters, and an interleaving unit for synthesizing each of the frequency domain signals acquired at the correcting step and generating a frequency spectrum of the digital signal.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
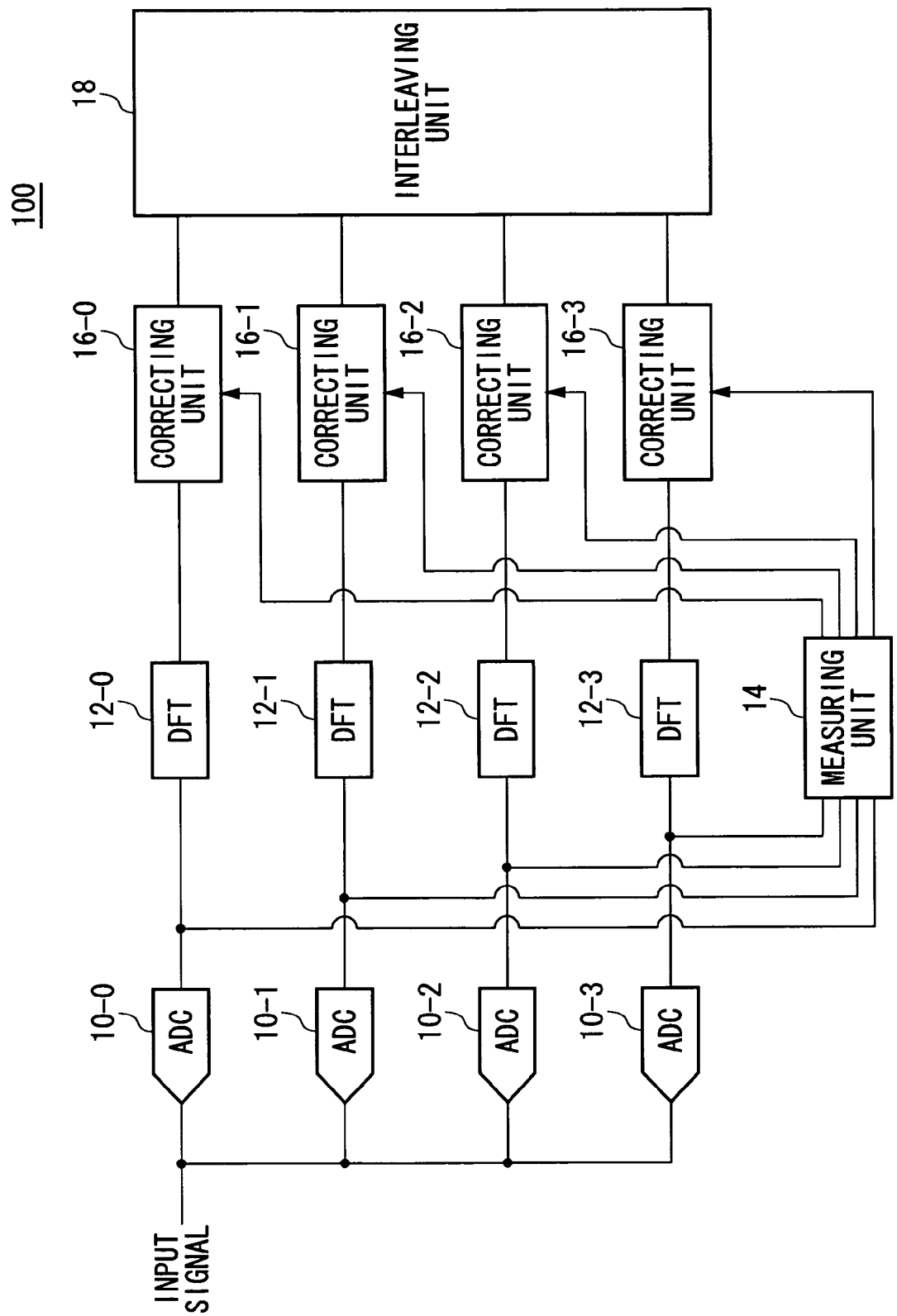
FIG. 1 shows an example of the configuration of an interleave AD converting apparatus 100 according to an embodiment of the present invention.

FIG. 1 shows an example of the configuration of an interleave AD converting apparatus 100 according to an embodiment of the present invention. The interleave AD converting apparatus 100 is an apparatus for converting an analog signal provided as an input signal into a digital signal and includes a plurality of ADCs (10-0 to 10-3, hereinafter, called generically as the ADC 10), a plurality of Fourier transformation units (12-0 to 12-3, hereinafter, called generically as the Fourier transformation unit 12), a plurality of correcting units (16-0 to 16-3, hereinafter, called generically as the correcting unit 16), a measuring unit 14 and an interleaving unit 18. Further, although the interleave AD converting apparatus 100 according to the present example converts an analog signal into a digital signal by using four ADCs 10, the number of the ADCs 10 is not limited to four. For example, the interleave AD converting apparatus 100 may convert an analog signal into a digital signal by using $2^n$ ADCs 10 (Here, n is an integer equal to or larger than one (1)) In this case, it is also possible to acquire a frequency spectrum of a digital signal with high accuracy by the operation similar to that of the interleave AD converting apparatus 100 according to the present example.

Each of the sampling clocks of which the phases are different by a predetermined phase is applied to each ADC 10. The applied sampling clocks will be explained with reference to FIG. 2. Then, the ADC 10 is provided with an analog signal as an input signal and samples the analog signal with response to the sampling clock.

Each Fourier transformation unit 12 is provided with correspondent to the ADC 10, performs Fourier transformation on the data generated by sampling the analog signal by each of the plurality of the ADCs 10, and generates a plurality of frequency domain signals corresponding to the plurality of the ADCs 10. The Fourier transformation unit 12 performs the Fourier transformation by, for example, discrete Fourier transformation.

The measuring unit 14 previously measures the frequency characteristic of each ADC 10. For example, the measuring unit 14 inputs the analog signal to each ADC 10 and measures the frequency characteristic of each ADC 10 on the basis of the data output from the ADC 10. In this case, the measuring unit 14 may measure each frequency characteristic by using the applied sampling clock in case of converting the analog signal into the digital signal. Accordingly, it is possible to measure the frequency characteristic of the sampling clock of each ADC 10 including a phase error of the applied sampling clock.

The correcting unit 16 converts each frequency domain signal into an ideal frequency domain signal to be obtained when the frequency characteristic of corresponding ADC 10 is ideal by multiplying each frequency domain signal by a correction coefficient determined on the basis of the frequency characteristics of all the ADCs 10. In this case, the frequency characteristic of any of the ADCs 10 may be set as the ideal frequency characteristic. Accordingly, it is possible to generate the ideal frequency domain signal in which the spurious components caused by the error in the frequency characteristic of each ADC 10 are eliminated.

Moreover, the interleaving unit 18 synthesizes each ideal frequency domain signal and generates a frequency spectrum of the digital signal. According to this configuration, it is possible to obtain the frequency spectrum in which the spurious components caused by the sampling frequency characteristic of the ADC 10 are eliminated.

Figure 2:
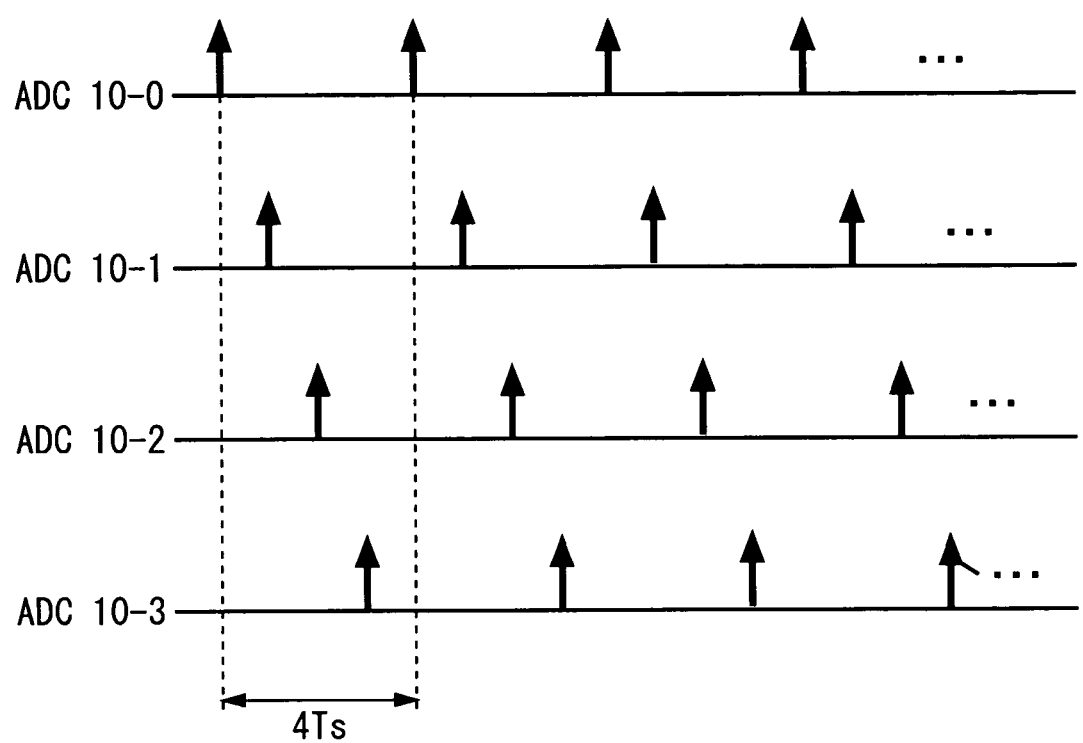
FIG. 2 is a drawing to describe a sampling clock applied to each ADC 10.

FIG. 2 is a drawing to describe sampling clocks applied to each ADC 10. For example, in case of converting the analog signal of the band [−1/(2Ts), 1/(2Ts)] into the digital signal, the sampling clock of which the frequency is 1/(4Ts) is applied to each ADC 10 and the applied sampling clocks are shifted by the phase Ts. It is possible to sample the analog signal at the rate of four (4) times as large as the sampling frequency of each ADC 10 by sampling the analog signal by using these sampling clocks.

Figure 3:
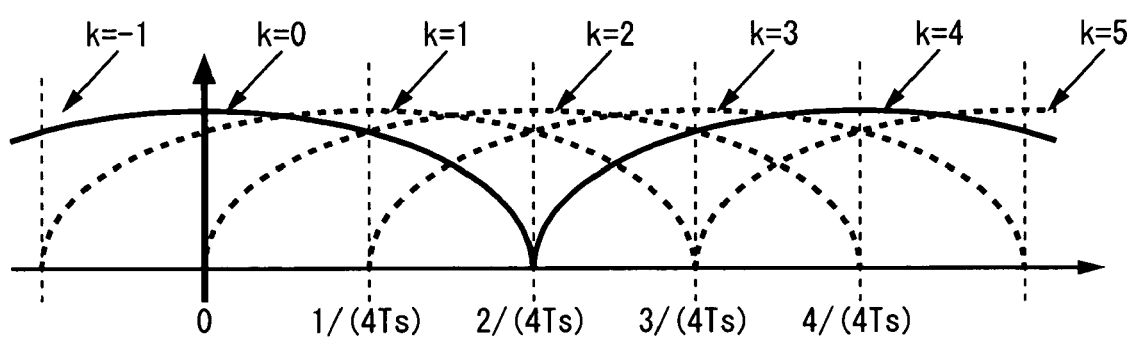
FIG. 3 shows an example of a frequency characteristic output from each Fourier transformation unit 12.

FIG. 3 shows an example of the frequency characteristics output from each Fourier transformation unit 12. For the frequency domain signal generated by sampling the analog signal of the band [−1/(2Ts), 1/(2TS)] at the frequency 1/(4Ts), the spurious components (k=−1, 1, 2, 3, 4, 5) are generated in addition to the signal component (k=0) described by a solid line in FIG. 3. Although all the frequency characteristics include the signal components and the spurious components as shown in FIG. 3, the directions of the components of each frequency characteristic are different from each other in a complex space, because the sampling clocks of each ADC 10 are shifted by Ts.

Figure 4:
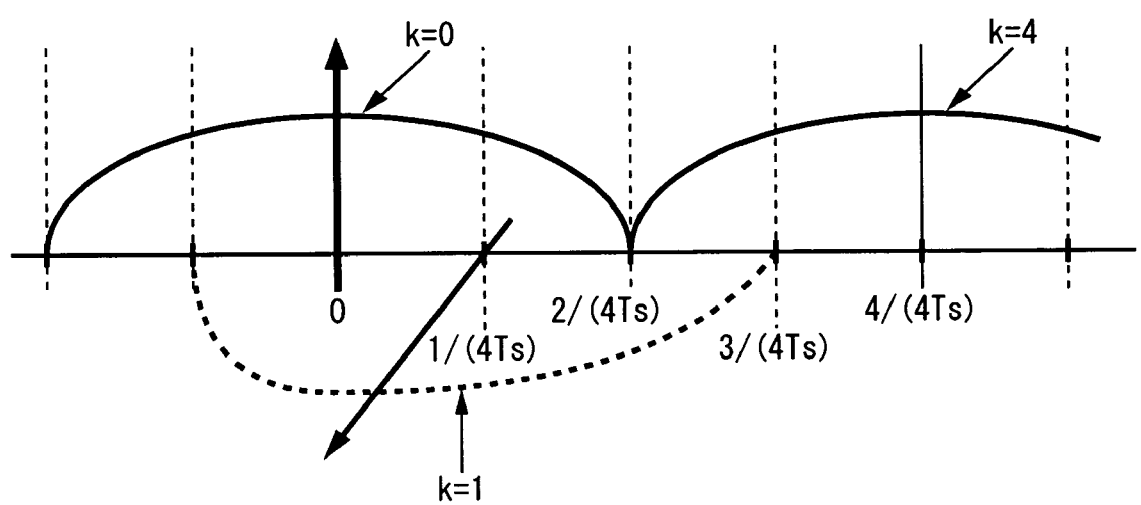
FIG. 4 shows an example of a part of the frequency characteristic output from a Fourier transformation unit 12-1.

FIG. 4 shows an example of a part of the frequency characteristic output from the Fourier transformation unit 12-1. If the directions of the components (k=−1 to 5) of the frequency characteristic output from the Fourier transformation unit 12-0 are same in the complex space as shown in FIG. 3, the direction of the signal component (k=0) in the frequency characteristic output from the Fourier transformation unit 12-1 is the same as that of the signal component of the frequency component output from the Fourier transformation unit 12-0 (refer to FIG. 3). However, since the phase of the sampling clock of the ADC 10-1 leads that of the sampling clock of the ADC 10-0 by Ts, the spurious component (k=1) of the frequency characteristic output from the Fourier transformation unit 12-1 is rotated by 90 degrees with respect to the signal component (k=0). Similarly, other spurious components (k=2, 3, 4, 5, which are not shown) are rotated by 90 degree sequentially.

Figure 5:
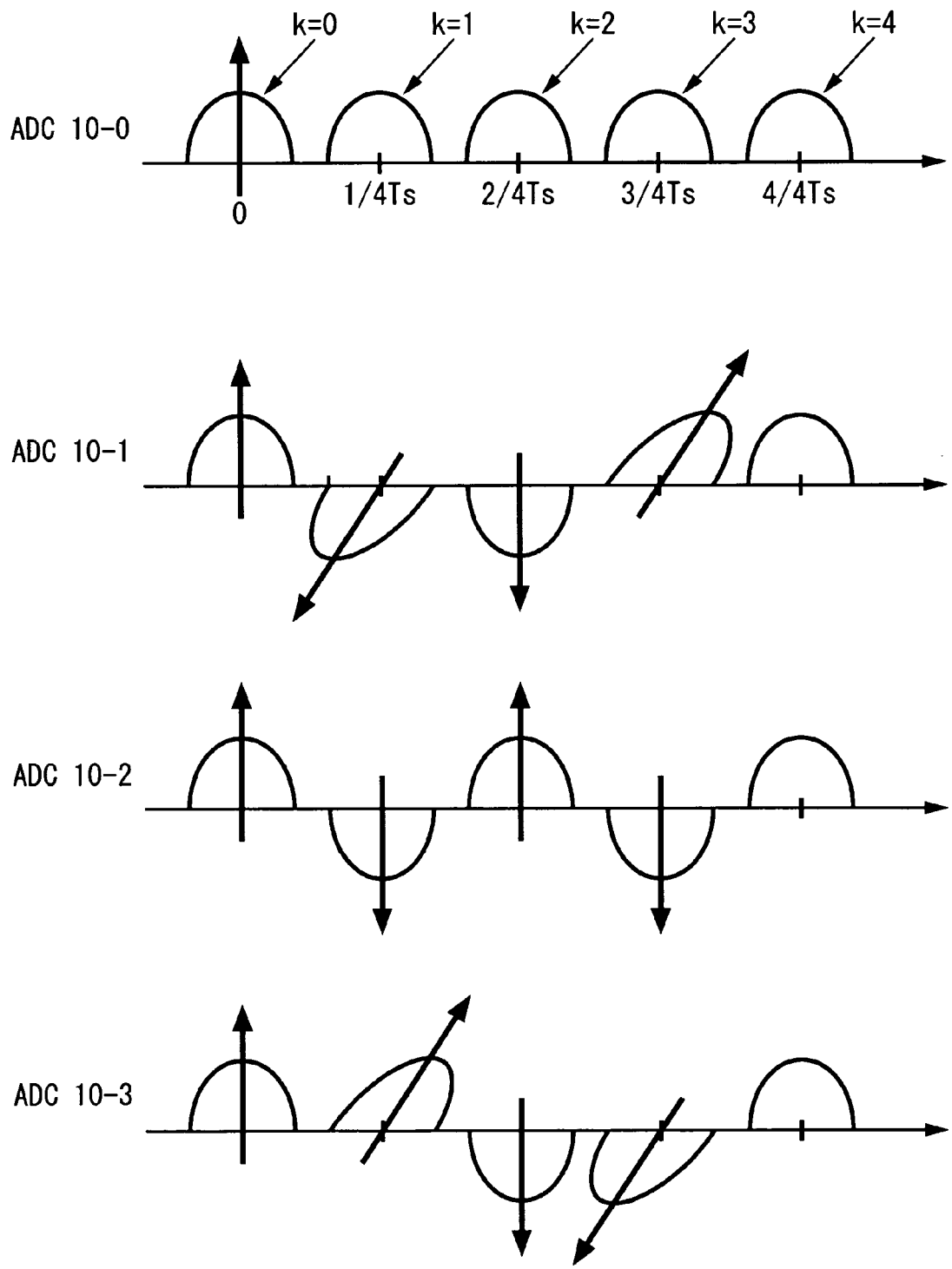
FIG. 5 shows an example of each of the frequency characteristics described in a complex space.

FIG. 5 shows an example of each of the frequency characteristics described in a complex space. Although the signal components and the spurious components are shown discretely in FIG. 5, they are same even if the band of the signal component and that of the spurious component are overlapped, as the frequency characteristics are shown in FIG. 3.

As described above, the components of the frequency characteristic output from the Fourier transformation unit 12-1 are rotated by 90 degree sequentially. Further, since the phase of the sampling clock of the ADC 10-2 leads that of the sampling clock of the ADC 10-0 by 2Ts, the components of the frequency characteristic output from the Fourier transformation unit 12-2 are rotated by 180 degree as shown in FIG. 5. Similarly, since the phase of the sampling clock of the ADC 10-3 leads that of the sampling clock of the ADC 10-0 by 3Ts, the components of the frequency characteristic output from the Fourier transformation unit 12-3 are rotated by 270 degree as shown in FIG. 5.

These frequency characteristics are synthesized so that the spurious components of each frequency characteristic (k=−1, 1, 2, 3, 5) cancel each other and only the signal component (k=0) and the aliasing component (k=4) remain. However, in case that the fluctuations in the sampling timings of the ADC 10 are caused by the phase error of each sampling clock and the frequency characteristic error of the ADC 10, the fluctuations in the angle of the spurious components are generated and the spurious components can not cancel each other.

Figure 6:
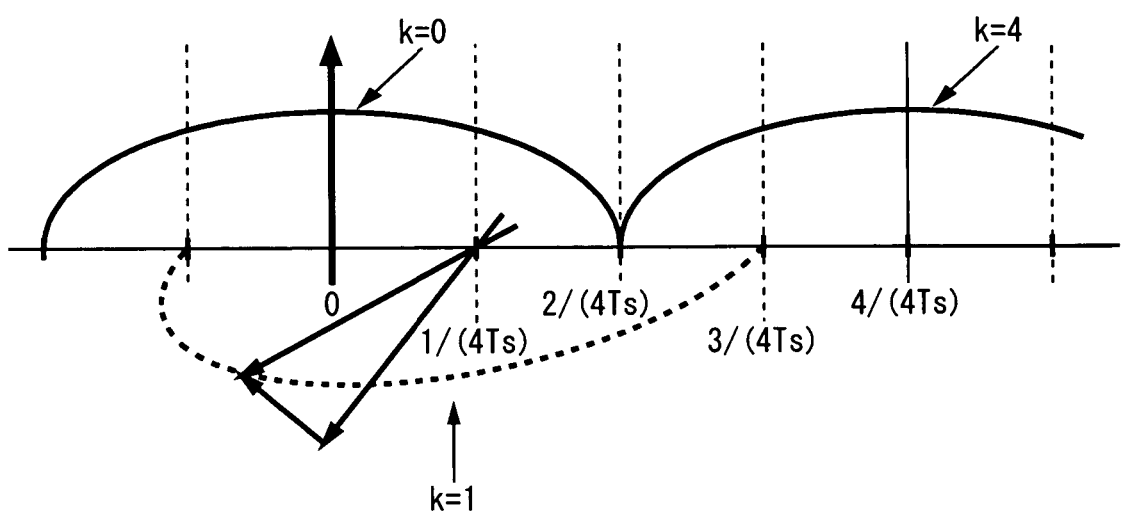
FIG. 6 shows another example of a part of the frequency characteristic output from a Fourier transformation unit 12-1.

FIG. 6 shows another example of a part of the frequency characteristic output from a Fourier transformation unit 12-1. As described above, in case that the phase error is caused in the sampling clock applied to the ADC 10-1 and the frequency characteristic of the ADC 10-1 is not ideal, the fluctuations in the angle of the spurious component are generated (for example, k=1), and then the spurious components (k=1) of another frequency characteristic cannot cancel each other and the spurious components remain in case of synthesizing each frequency characteristic.

The interleave AD converting apparatus 100 described with reference to FIG. 1 eliminates the spurious components by correcting fluctuations in the angle of these spurious components due to the frequency characteristic of the ADC 10 and the phase error of the sampling clock and performing interleaving. Next, the operation of the interleave AD converting apparatus 100 is described in detail.

Figure 7:
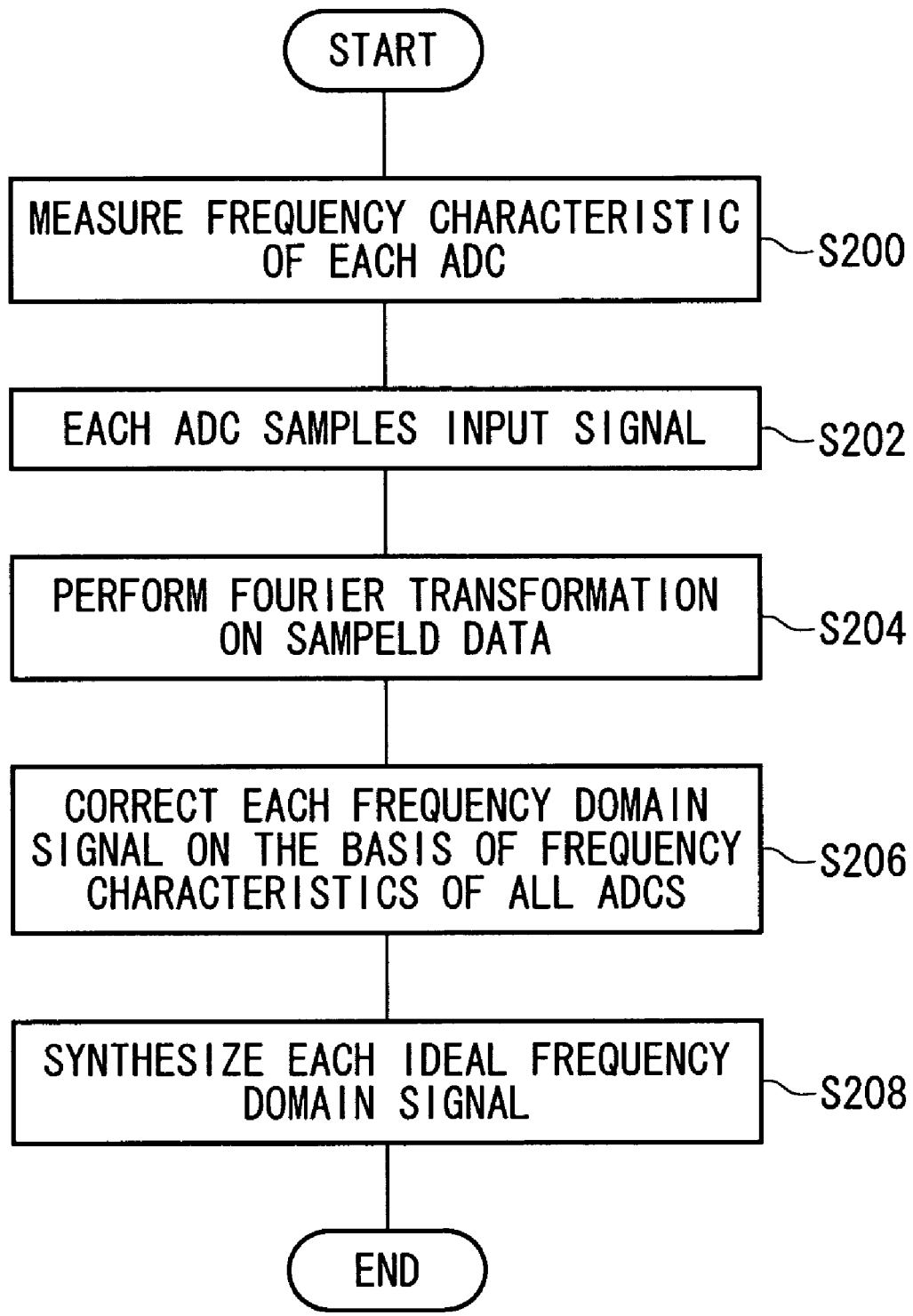
FIG. 7 is a flow chart showing an example of the operation of the interleave AD converting apparatus 100.

FIG. 7 is a flow chart showing an example of the operation of the interleave AD converting apparatus 100. First, according to the measuring step S200, the measuring unit 10 previously measures the frequency characteristic of each ADC 10. Here, the frequency characteristic of each ADC 10 is represented by the following equation, $$a_l(k) = \frac{1}{4Ts} a\left(f - \frac{k}{4Ts}\right) e^{-j\pi k l/2}$$

Here, l denotes the corresponding ADC 10 and l=0, 1, 2, 3.

Then, according to the sampling step S202, the plurality of the ADCs 10 sample the analog signal provided as an input signal. In this case, the sampling clocks $p_0(t)$, $p_1(t)$, $p_2(t)$ and $p_3(t)$ applied to the ADC 10 are represented by the following equations, $$p_0(t) = \sum_{n=-\infty}^{\infty} \delta(t - 4nTs)$$

$$p_1(t) = \sum_{n=-\infty}^{\infty} \delta(t - (4n+1)Ts)$$

$$p_2(t) = \sum_{n=-\infty}^{\infty} \delta(t - (4n+2)Ts)$$

$$p_3(t) = \sum_{n=-\infty}^{\infty} \delta(t - (4n+3)Ts).$$

Equation (1)

According to the Fourier transformation step S204, the Fourier transformation unit 12 performs the Fourier transformation on the data sampled by the plurality of the ADCs 10 and generates a plurality of the frequency domain signals corresponding to the plurality of the ADCs 10. In this case, the Fourier transformation of the sampling clock described in the equation (1) is represented by the following equation, $$P_1(f) = e^{-j2\pi f(lTs)} \frac{1}{4Ts} \sum_{k=-\infty}^{\infty} \delta\left(f - \frac{k}{4Ts}\right). \quad \text{Equation (2)}$$

The frequency domain signal $X_1(f)$ output from each Fourier transformation unit 12 by using the equation (2) is represented by the following equation, $$X_1(f) = \frac{1}{4Ts} \sum_{k=-\infty}^{\infty} X\left(f - \frac{k}{4Ts}\right) e^{-j\pi k l/2}. \quad \text{Equation (3)}$$

Further, in case of $$\overline{x}(k) = \frac{1}{4Ts} X\left(f - \frac{k}{4Ts}\right),$$

each frequency domain signal is represented as follows. According to the present example, the frequency characteristic of the ADC 10-0 is set as an ideal frequency characteristic. That is, it is explained by $a_0(k)=1$.

$X_0(f) = \overline{x}(-1) + \overline{x}(0) + \overline{x}(1) + \overline{x}(2) + \overline{x}(3) + \overline{x}(4) + \overline{x}(5)$ $X_1(f) = a_1(-1)\overline{x}(-1) + a_1(0)\overline{x}(0) + a_1(1)\overline{x}(1) + a_1(2)\overline{x}(2) + a_1(3)\overline{x}(3) + a_1(4)\overline{x}(4) + a_1(5)\overline{x}(5)$ $X_2(f) = a_2(-1)\overline{x}(-1) + a_2(0)\overline{x}(0) + a_2(1)\overline{x}(1) + a_2(2)\overline{x}(2) + a_2(3)\overline{x}(3) + a_2(4)\overline{x}(4) + a_2(5)\overline{x}(5)$ $X_3(f) = a_3(-1)\overline{x}(-1) + a_3(0)\overline{x}(0) + a_3(1)\overline{x}(1) + a_3(2)\overline{x}(2) + a_3(3)\overline{x}(3) + a_3(4)\overline{x}(4) + a_3(5)\overline{x}(5)$ Equation (4)

(Here, $f_s$ represents the sampling frequency of each analog-to-digital converter, the terms from k=−1 to 5 in the above equations represent the components included in the band [0, 4$f_s$] in case that the band of X(f) is set to [−2$f_s$, 2$f_s$], and $a_j(k)$ is a component corresponding to $\overline{x}(k)$ of the frequency characteristic of j-th analog-to-digital converter.)

For the correcting step S206, the correcting unit 16 multiplies each frequency domain signal by a correction coefficient based on the frequency characteristics of all ADCs 10 in order to convert each frequency domain signal into the frequency domain signal acquired when the frequency characteristic of the corresponding ADC 10 is ideal. According to the present example, in case that the linear sum of each frequency component $X_0(f)$ to $X_3(f)$ represented in the equation (4) is acquired, the correcting unit 16 multiplies each frequency characteristic by a correction coefficient where the spurious components of k=−1, 1, 2, 3, 5 are eliminated and only the signal component of k=0 and the aliasing components of the signal component remain. Accordingly, the correction coefficients $L_1$, $L_2$, $L_3$ are acquired by following equation, $X_0(f) + L_1 X_1(f) + L_2 X_2(f) + L_3 X_3(f) = \alpha \overline{x}(0) + \beta \overline{x}(4)$ Equation (5), and multiplied by each frequency characteristic. Here, $\alpha$ and $\beta$ are arbitrary real numbers.

In this case, the correcting unit 16 divides the frequency band [−2fs, 2fs] of the digital signal to be acquired according to the number of the ADC 10. According to the present example, the correcting unit 16 divides the frequency band of the digital signal to be acquired into the first region of which the band is [0, fs], the second region of which the band is [fs, 2fs], the third region of which the band is [2fs, 3fs], and the fourth region of which the band is [3fs, 4fs].

As known from the equation (4), although the spurious components included in the frequency band [−2fs, 2fs] of the digital signal are four (4), that is, k=−1, 1, 2, 3, as obvious from the equation (5), the correction coefficients $L_1$, $L_2$, $L_3$ eliminating four spurious components at the same time do not exist. However, as shown in FIG. 3, it is possible to make the number of the spurious components be three in each divided region by dividing the frequency band of the digital signal by the present example. For this reason, the correcting unit 16 can acquire each correction coefficient for each frequency band represented by the following equation; the first region, $$\begin{pmatrix} L_1 \\ L_2 \\ L_3 \end{pmatrix} = \begin{pmatrix} a_1(-1) & a_2(-1) & a_3(-1) \\ a_1(1) & a_2(1) & a_3(1) \\ a_1(2) & a_2(2) & a_3(2) \end{pmatrix}^{-1} \begin{pmatrix} -1 \\ -1 \\ -1 \end{pmatrix}, \quad \text{Equation (6)}$$

the second region and the third region, $$\begin{pmatrix} L_1 \\ L_2 \\ L_3 \end{pmatrix} = \begin{pmatrix} a_1(1) & a_2(1) & a_3(1) \\ a_1(2) & a_2(2) & a_3(2) \\ a_1(3) & a_2(3) & a_3(3) \end{pmatrix}^{-1} \begin{pmatrix} -1 \\ -1 \\ -1 \end{pmatrix}, \quad \text{Equation (7)}$$

and the fourth region, $$\begin{pmatrix} L_1 \\ L_2 \\ L_3 \end{pmatrix} = \begin{pmatrix} a_1(2) & a_2(2) & a_3(2) \\ a_1(3) & a_2(3) & a_3(3) \\ a_1(5) & a_2(5) & a_3(5) \end{pmatrix}^{-1} \begin{pmatrix} -1 \\ -1 \\ -1 \end{pmatrix}. \quad \text{Equation (8)}$$

Then, for the synthesizing step S208, the interleaving unit 18 synthesizes each frequency domain signal acquired at the correcting step S206 and generates the frequency spectrum of the digital signal. In this case, since each frequency domain signal is multiplied by the acquired correction coefficients $L_1$, $L_2$, $L_3$, the phases of the signal component (k=0) and the aliasing component (k=4) are changed. For this reason, at the correcting step S206, the correction coefficient for correcting this change is further acquired.

According to the present example, the correcting step S206 includes a first acquiring step and a second acquiring step for acquiring first and second correction coefficients. According to the first acquiring step, the first correction coefficients $L_1$, $L_2$, $L_3$ by which each frequency domain signal is multiplied are acquired respectively on the basis of the frequency characteristics of all the ADCs 10 in order that the spurious components of each frequency domain signal, caused by the frequency characteristic of each ADC 10, cancel each other. Further, according to the first acquiring step, the first correction coefficients $L_1$, $L_2$, $L_3$, which make the spurious components of each frequency signal exist in each divided region of the frequency band as described above cancel each other, are acquired for each divided region.

Further, according to the second acquiring step, the second correction coefficient is acquired for each divided region on the basis of each first correction coefficient and each frequency characteristic in order to correct the phase errors of the signal component and the aliasing component of the frequency domain signal due to the multiplication of the first correction coefficient. Since the only signal component (k=0) remains in the first and the second region, in the first region and the second region, $1/(1+a_1(0)L_1+a_2(0)L_2+a_3(0)L_3)$ is acquired as the second correction coefficient. Moreover, since the only aliasing component (k=4) remains in the third and the fourth region, $1/(1+a_1(4)L_1+a_2(4)L_2+a_3(4)L_3)$ is acquired as the second correction coefficient.

Then, at the synthesizing step S208, the synthesis of each frequency domain signal acquired at the correcting step S206 is multiplied by the second correction coefficient as described above. In addition, although according to the present example, the second correction coefficient is multiplied at the synthesizing step S208, according to another example, it may be multiplied at the correcting step S206. Moreover, according to the correcting step S206, each frequency domain signal may be multiplied by corresponding first and second correction coefficients.

As described above, at the synthesizing step S208, the frequency spectrum of the digital signal is acquired for each region on the basis of the following equation;
the first and the second regions $$X'(f) = \frac{1}{1 + a_1(0)L_1 + a_2(0)L_2 + a_3(0)L_3} \quad \text{Equation (9)}$$
$$\{X_0(f) + L_1 X_1(f) + L_2 X_2(f) + L_3 X_3(f)\},$$

and
the third and the fourth regions, $$X'(f) = \frac{1}{1 + a_1(4)L_1 + a_2(4)L_2 + a_3(4)L_3} \quad \text{Equation (10)}$$
$$\{X_0(f) + L_1 X_1(f) + L_2 X_2(f) + L_3 X_3(f)\}.$$

In addition, according to the synthesizing step S208, the frequency spectrum in the first region is acquired by using the correction coefficients $L_1$, $L_2$, $L_3$ acquired on the basis of the equation (6) for the equation (9). Moreover, the frequency spectrum for the second region is acquired by using the correction coefficients $L_1$, $L_2$, $L_3$ acquired on the basis of the equation (7) for the equation (9), the frequency spectrum for the third region is acquired by using the correction coefficients $L_1$, $L_2$, $L_3$ on the basis of the equation (7) for the equation (10) and the frequency spectrum for the fourth region is acquired by using the correction coefficient $L_1$, $L_2$, $L_3$ acquired on the basis of the equation (8) for the equation (10). According to this operation, the frequency spectrum in which the spurious components are eliminated can be obtained.

Moreover, although according to the present example, the frequency characteristic of the ADC 10-0 is explained as the ideal frequency characteristic, even if the frequency characteristic of the ADC 10-0 is not ideal, it is possible to perform the correction and eliminate the spurious components on the basis of the frequency characteristic similarly.

In this case, it is possible to perform the correction by dividing the frequency characteristic of another ADC 10 by the frequency characteristic of the ADC 10-0. Accordingly, if the previously measured frequency characteristic of the ADC 10-1 (l=0, 1, 2, 3) is Fad(l) respectively, each frequency characteristic $a_1(k)$ used for the correction is given by the following equations, $a_0(k)=Fad(0)$ $a_1(k)=Fad(1)/Fad(0)$ $a_2(k)=Fad(2)/Fad(0)$ $a_3(k)=Fad(3)/Fad(0)$ \hfill Equation (11).

Further, the equations (9) and (10) are given by following equations by using the frequency characteristics represented by the equation (11), $$X'(f) = \frac{1}{a_0(0)} \cdot \frac{1}{1 + a_1(0)L_1 + a_2(0)L_2 + a_3(0)L_3} \quad \text{Equation (9)}$$
$$\{X_0(f) + L_1 X_1(f) + L_2 X_2(f) + L_3 X_3(f)\},$$

$$X'(f) = \frac{1}{a_0(4)} \cdot \frac{1}{1 + a_1(4)L_1 + a_2(4)L_2 + a_3(4)L_3} \quad \text{Equation (10)}$$
$$\{X_0(f) + L_1 X_1(f) + L_2 X_2(f) + L_3 X_3(f)\}.$$

Although it is explained the provided analog signal as the complex signal in the above, if the provided analog signal is a real signal, the only operations corresponding to the first and the second region of the correcting methods as above are performed. For example, at the synthesizing step S208, the frequency spectrums in the first and the second regions are acquired by using the correction coefficients acquired on the basis of the equations (6) and (7) for the equation (9) and the complex conjugates of the frequency spectrums in the first and the second regions are acquired as the frequency spectrums in the third and the fourth regions.

Further, although, according to the present example, the band of the acquired frequency spectrum is [0, 4fs], even if the band is [−2fs, 2fs], it is possible to perform the similar operation. For example, it is possible to eliminate the spurious component by a similar operation by making the bands of the third and the fourth regions [−fs, 0] and [−2fs, −fs].

In addition, each frequency characteristic may be acquired on the basis of the frequency characteristic a(0) of k=0, as follows;
a(−1) . . . a(0) is shifted by −fs/4
a(1) . . . a(0) is shifted by fs/4
a(2) . . . a(0) is shifted by 2fs/4
a(3) . . . a(0) is shifted by 3fs/4
a(5) . . . a(0) is shifted by 5fs/4.

Further, in case that the Fourier transformation unit 12 performs the discrete Fourier transformation, the discrete Fourier transformation of the sampling clock denoted in the equation (1) is given by following equations, $$DFT_0(k) = \sum_{n=0}^{(N/4)-1} x(4nT_s)e^{-j2\pi kn/\frac{N}{4}} \quad \text{Equation (11)}$$

-continued $$DFT_1(k) = \sum_{n=0}^{(N/4)-1} x((4n+1)Ts)e^{-j2\pi kn/\frac{N}{4}}$$

$$DFT_2(k) = \sum_{n=0}^{(N/4)-1} x((4n+2)Ts)e^{-j2\pi kn/\frac{N}{4}}$$

$$DFT_3(k) = \sum_{n=0}^{(N/4)-1} x((4n+3)Ts)e^{-j2\pi kn/\frac{N}{4}}.$$

Then, the frequency domain signal on which the discrete Fourier transformation is performed is given by the following equation, $$X_l\left(\frac{k}{NTs}\right) = \sum_{n=0}^{(N/4)-1} x((4n+l)Ts)e^{-j2\pi f((4n+l)Ts)}$$

$$= e^{-j2\pi kl/N} \sum_{n=0}^{(N/4)-1} x((4n+l)Ts)e^{-j2\pi kn/\frac{N}{4}}$$

$$= e^{-j2\pi kl/N} DFT_l(k)$$

For this reason, the equations (9) and (10) are represented by the following equations, $$X'(f) = \frac{1}{1 + a_1(0)L_1 + a_2(0)L_2 + a_3(0)L_3 +} \quad \text{Equation (9)}'$$
$$L_2 \cdot e^{-j2\pi k \cdot 2/N} \cdot DFT_2(k) +$$
$$L_3 \cdot e^{-j2\pi k \cdot 3/N} DFT_3(k))$$

$$(DFT_0(k) + L_1 \cdot e^{-j2\pi k \cdot 1/N} \cdot DFT_1(k), \text{ and}$$

$$X'(f) = \frac{1}{1 + a_1(4)L_1 + a_2(4)L_2 + a_3(4)L_3 +} \quad \text{Equation (10)}'$$
$$L_2 \cdot e^{-j2\pi k \cdot 2/N} \cdot DFT_2(k) +$$
$$L_3 \cdot e^{-j2\pi k \cdot 3/N} DFT_3(k))$$

$$(DFT_0(k) + L_1 \cdot e^{-j2\pi k \cdot 1/N} \cdot DFT_1(k).$$

Further, although, according to the present example, the number of the ADC 10 is four, even if the number of the ADC 10 is N (N is an integer equal to or larger than two (2)), the frequency spectrum in which the spurious components are eliminated can be acquired similarly. For example, the equations (4), (5), (9) and (10) are given by the following equations, $$X_0(f) = \bar{x}(-l) + \bar{x}(-l+1) + \cdots + \bar{x}(m-1) + \bar{x}(m) \quad \text{Equation (4)}'$$

$$X_1(f) = a_1(-l)\bar{x}(-l) +$$
$$a_1(-l+1)\bar{x}(-l+1) + \cdots + a_1(m-1)\bar{x}(m)$$

$$\vdots$$

$$X_{N-1}(f) = a_{N-1}(-l)\bar{x}(-l) +$$
$$a_{N-1}(-l+1)\bar{x}(-l+1) + \cdots + a_{N-1}(m-1)\bar{x}(m),$$

(In the above equation, the terms from −1 to m are components included in the band [0, Nfs] in case that the band of X(f) is set to [−Nfs/2, Nfs/2] (fs is the sampling frequency of each analog-to-digital converter) and $a_j(k)$ is a component corresponding to $$\bar{x}(k)$$

of the frequency characteristic of the j-th analog-to-digital converter.), $$X_0(f) + L_1 X_1(f) + L_2 X_2(f) + \ldots + L_{N-1} X_{N-1}(f) = \alpha \bar{x}(0) + \beta$$
$$\bar{x}(u) \quad \text{Equation (5)}'$$

(In the above equation, α and β are arbitrary real numbers and x(u) is the aliasing component of the x(0).), $$X'(f) = \frac{1}{1 + a_1(0)L_1 + a_2(0)L_2 +} \quad \text{Equation (9)}''$$
$$\cdots + a_{N-1}(0)L_{N-1} +$$
$$L_2 X_2(f) + \cdots + L_{N-1} X_{N-1}(f)\}$$
$$\{X_0(f) + L_1 X_1(f), \text{ and}$$

$$X'(f) = \frac{1}{1 + a_1(u)L_1 + a_2(u)L_2 +} \quad \text{Equation (10)}''$$
$$\cdots + a_{N-1}(u)L_{N-1} +$$
$$L_2 X_2(f) + \cdots + L_{N-1} X_{N-1}(f)\}$$

Although the present invention has been described by way of exemplary embodiments, it should be understood that those skilled in the art might make many changes and substitutions without departing from the spirit and the scope of the present invention which is defined only by the appended claims.

As obvious from the above description, according to the present invention, it is possible to acquire the frequency spectrum in which the spurious components are eliminated for the interleave AD conversion.

What is claimed is:

1. An analog-to-digital converting method for converting an analog signal into a digital signal by using a plurality of analog-to-digital converters, wherein phases of sampling clocks applied to said plurality of analog-to-digital converters differ by a predetermined period, comprising:
    a measuring step of measuring a frequency characteristic of each of said analog-to-digital converters in advance;
    a sampling step of sampling the analog signal by using said plurality of analog-to-digital converters;
    a Fourier transformation step of performing Fourier transformation on the data sampled by each of said plurality of analog-to-digital converters and generating a plurality of frequency domain signals corresponding to said plurality of analog-to-digital converters;
    a correcting step of converting each of the frequency domain signals into a signal to be acquired in case that the frequency characteristic of said corresponding analog-to-digital converter is ideal, by multiplying each of the frequency domain signals by a correction coefficient determined on the basis of the frequency characteristics of all said analog-to-digital converters; and
    a synthesizing step of synthesizing each of the frequency domain signals acquired at said correcting step and generating a frequency spectrum of the digital signal.

2. An analog-to-digital converting method as claimed in claim 1, wherein, for said correcting step, the frequency characteristic of one of said plurality of the analog-to-digital converters is set as an ideal frequency characteristic.

3. An analog-to-digital converting method as claimed in claim 1, wherein
    said correcting step comprises:

a first acquiring step of acquiring a first correcting coefficients by which each frequency domain signal is multiplied on the basis of the frequency characteristics of all said analog-to-digital converters, in order to totally eliminate spurious components due to the frequency characteristic of said each analog-to-digital converter; and a second acquiring step of acquiring a second correction coefficient based on each of the fist correction coefficients and the frequency characteristic of said each analog-to-digital converter, in order to correct errors in the phase of each frequency domain signal generated by the multiplication of the first correction coefficients, and each of the frequency domain signals is multiplied by corresponding first correction coefficient, and the frequency domain signals, each of which is multiplied by corresponding first correction coefficient, are synthesized and the synthesized signal is multiplied by the second correction coefficient at said synthesizing step.

4. An analog-to-digital converting method as claimed in claim 1, wherein said correcting step comprises:

a first acquiring step of acquiring a first correcting coefficients by which each frequency domain signal is multiplied on the basis of the frequency characteristics of all said analog-to-digital converters, in order to totally eliminate spurious components due to the frequency characteristic of said each analog-to-digital converter; and a second acquiring step of acquiring second correction coefficients based on each of the fist correction coefficients and the frequency characteristic of said each analog-to-digital converter, in order to correct errors in the phase of each frequency domain signal generated by the multiplication of the first correction coefficients, and each of the frequency domain signals is multiplied by corresponding first correction coefficient and corresponding second correction coefficient.

5. An analog-to-digital converting method as claimed in claim 3 or 4, wherein, at said correction step, the frequency band of the digital signal to be acquired is divided according to the number of said analog-to-digital converters, each of the first correction coefficients is acquired at every divided frequency band at said first acquiring step, and the second correction coefficient is acquired at every divided frequency band at said second acquiring step.

6. An analog-to-digital converting method as claimed in claim 5, wherein, the first correction coefficients are acquired at every divided frequency band at said first acquiring step, the first correction coefficients totally eliminating the spurious components of each frequency domain signal which exist in each divided frequency band.

7. An analog-to-digital converting method as claimed in claim 1, wherein the frequency characteristic including a phase error of the sampling clock applied to said each analog-to-digital converter is measured by measuring the frequency characteristic of said each analog-to-digital converter by using the sampling clock applied to each analog-to-digital converter when the analog signal is converted into the digital signal, at the measuring step.

8. An analog-to-digital converting method as claimed in claim 3 or 4, wherein said analog-to-digital converting method generates the digital signal by using N analog-to-digital converters (Here, N is an integer equal to or larger than two (2).), and N frequency domain signals $X_0(f)$ to $X_{N-1}(f)$ are represented by the following equations, $$X_0(f) = \bar{x}(-l) + \bar{x}(-l+1) + \cdots + \bar{x}(m-1) + \bar{x}(m)$$

$$X_1(f) = a_1(-l)\bar{x}(-l) + a_1(-l+1)\bar{x}(-l+1) + \cdots + a_1(m-1)\bar{x}(m)$$

$$\vdots$$

$$X_{N-1}(f) = a_{N-1}(-l)\bar{x}(-l) + a_{N-1}(-l+1)\bar{x}(-l+1) + \cdots + a_{N-1}(m-1)\bar{x}(m)$$

(Here, $f_s$ represents the sampling frequency of said each analog-to-digital converter, the terms from $-1$ to m in the above equations represent the components included in the band $[0, N_{fs}]$ in case that the band of X(f) is set to $[-N_{fs}/2, N_{fs}/2]$, and $a_j(k)$ is one corresponding to $\bar{x}(k)$ of the frequency characteristic of j-th analog-to-digital converter.), and for said first acquiring step, the first correction coefficients $L_1, L_2, \ldots, L_{N-1}$ which satisfy the following equation, $X_0(f)+L_1X_1(f)+L_2X_2(f)+ \ldots +L_{N-1}X_{N-1}(f)=\alpha\bar{x}(0)+\beta\bar{x}(u)$ (In the above equation, $\alpha$ and $\beta$ are arbitrary real numbers and x(u) is an aliasing component of x(0).) are acquired.

9. An analog-to-digital converting method as claimed in claim 8, wherein the second correction coefficient represented by the following expression, $$\frac{1}{1 + a_1(0)L_1 + a_2(0)L_2 + \cdots + a_{N-1}(0)L_{N-1}}$$

is acquired at said second acquiring step, and the digital signal X'(f) is acquired on the basis of the following equation, $$X'(f) = \frac{1}{1 + a_1(0)L_1 + a_2(0)L_2 + \cdots + a_{N-1}(0)L_{N-1}} \{X_0(f) + L_1X_1(f) + L_2X_2(f) + \cdots + L_{N-1}X_{N-1}(f)\} \quad (1)$$

at said synthesizing step.

10. An analog-to-digital converting method as claimed in claim 3 or 4, wherein said analog-to-digital converting method generates a digital signal by using four (4) analog-to-digital converters, the frequency domain signals $X_0(f)$ to $X_3(f)$ are represented by the following equations, $X_0(f)=\bar{x}(-1)+\bar{x}(0)+\bar{x}(1)+\bar{x}(2)+\bar{x}(3)+\bar{x}(4)+\bar{x}(5)$ $X_1(f)=a_1(-1)\bar{x}(-1)+a_1(0)\bar{x}(0)+a_1(1)\bar{x}(1)+a_1(2)\bar{x}(2)+a_1(3)\bar{x}(3)+a_1(4)\bar{x}(4)+a_1(5)\bar{x}(5)$ $X_2(f)=a_2(-1)\bar{x}(-1)+a_2(0)\bar{x}(0)+a_2(1)\bar{x}(1)+a_2(2)\bar{x}(2)+a_2(3)\bar{x}(3)+a_2(4)\bar{x}(4)+a_2(5)\bar{x}(5)$ $X_3(f)=a_3(-1)\bar{x}(-1)+a_3(0)\bar{x}(0)+a_3(1)\bar{x}(1)+a_3(2)\bar{x}(2)+a_3(3)\bar{x}(3)+a_3(4)\bar{x}(4)+a_3(5)\bar{x}(5)$ (Here, $f_s$ represents the sampling frequency of said each analog-to-digital converter, the terms from k=−1 to 5 in the above equations represent the components included in the band [0, $4f_s$] in case that the band of X(f) is set to [$-2f_s$, $2f_s$], and $a_j(k)$ is a component corresponding to $\bar{x}(k)$ of the frequency characteristic of j-th analog-to-digital converter.), and for said first acquiring step, the first correction coefficients $L_1, L_2, \ldots, L_{N-1}$ which satisfy the following equation, $X_0(f)+L_1X_1(f)+L_2X_2(f)+L_3X_3(f)=\alpha\bar{x}(0)+\beta\bar{x}(4)$ (In the above equation, α and β are arbitrary real numbers and x(u) is an aliasing component of x(0).), are acquired.

11. An analog-to-digital converting method as claimed in claim 10, wherein the second correction coefficient represented by the following expression, $$\frac{1}{1+a_1(0)L_1+a_2(0)L_2+a_3(0)L_3}$$

is acquired at said second acquiring step, and the frequency spectrum of the digital signal X'(f) is acquired on the basis of the following equation, $$X'(f) = \frac{1}{1+a_1(0)L_1+a_2(0)L_2+a_3(0)L_3}\{X_0(f)+L_1X_1(f)+L_2X_2(f)+L_3X_3(f)\}$$

at said synthesizing step.

12. An analog-to-digital converting method as claimed in claim 11, wherein, at said correcting step, the frequency band of the digital signal to be acquired is divided into a first region of which band is [0, $f_s$], a second region of which band is [$f_s$, $2f_s$], a third region of which band is [$2f_s$, $3f_s$], and a fourth region of which band is [$3f_s$, $4f_s$], at the first acquiring step, the first correction coefficient for the first region is acquired on the basis of the following equation, $$\begin{pmatrix}L_1\\L_2\\L_3\end{pmatrix}=\begin{pmatrix}a_1(-1)&a_2(-1)&a_3(-1)\\a_1(1)&a_2(1)&a_3(1)\\a_1(2)&a_2(2)&a_3(2)\end{pmatrix}^{-1}\begin{pmatrix}-1\\-1\\-1\end{pmatrix}$$

the first correction coefficients for the second and the third regions are acquired on the basis of the following equation, $$\begin{pmatrix}L_1\\L_2\\L_3\end{pmatrix}=\begin{pmatrix}a_1(1)&a_2(1)&a_3(1)\\a_1(2)&a_2(2)&a_3(2)\\a_1(3)&a_2(3)&a_3(3)\end{pmatrix}^{-1}\begin{pmatrix}-1\\-1\\-1\end{pmatrix}$$

and the first correction coefficient for the fourth region is acquired on the basis of the following equation, $$\begin{pmatrix}L_1\\L_2\\L_3\end{pmatrix}=\begin{pmatrix}a_1(2)&a_2(2)&a_3(2)\\a_1(3)&a_2(3)&a_3(3)\\a_1(5)&a_2(5)&a_3(5)\end{pmatrix}^{-1}\begin{pmatrix}-1\\-1\\-1\end{pmatrix}$$

13. An analog-to-digital converting method as claimed in claim 12, wherein, at said synthesizing step, the frequency spectrum of the digital signal X'(f) for each of the first and the second regions is acquired on the basis of the following equation, $$X'(f) = \frac{1}{1+a_1(0)L_1+a_2(0)L_2+a_3(0)L_3}\{X_0(f)+L_1X_1(f)+L_2X_2(f)+L_3X_3(f)\}$$

and the frequency spectrum of the digital signal X'(f) for each of the third and the fourth regions is acquired on the basis of the following equation, $$X'(f) = \frac{1}{1+a_1(4)L_1+a_2(4)L_2+a_3(4)L_3}\{X_0(f)+L_1X_1(f)+L_2X_2(f)+L_3X_3(f)\}$$

14. An analog-to-digital converting apparatus for converting an analog signal into a digital signal comprising:

a plurality of analog-to-digital converters, wherein the phases of the sampling clocks applied to said plurality of analog-to-digital converters differ by a predetermined period;

a measuring unit for measuring a frequency characteristic of each of said analog-to-digital converters in advance;

a Fourier transformation unit for performing Fourier transformation on the data sampled by each of said plurality of analog-to-digital converters and generating a plurality of frequency domain signals corresponding to said plurality of analog-to-digital converters;

a correcting unit for converting each of the frequency domain signals into a signal acquired in case that the frequency characteristic of said corresponding analog-to-digital converter is ideal, by multiplying each of the frequency domain signals by a correction coefficient determined on the basis of the frequency characteristics of all said analog-to-digital converters; and an interleaving unit for synthesizing each of the frequency domain signals acquired at said correcting step and generating a frequency spectrum of the digital signal.

* * * * *